(12) United States Patent
Wu et al.

(10) Patent No.: US 12,350,913 B2
(45) Date of Patent: Jul. 8, 2025

(54) ROLLABLE DISPLAY DEVICE

(71) Applicant: InnoLux Corporation, Miao-Li County (TW)

(72) Inventors: Yuan-Lin Wu, Miao-Li County (TW); Tsung-Han Tsai, Miao-Li County (TW); Kuan-Feng Lee, Miao-Li County (TW)

(73) Assignee: InnoLux Corporation, Miao-Li County (TW)

( * ) Notice: Subject to any disclaimer, the term of this patent is extended or adjusted under 35 U.S.C. 154(b) by 341 days.

(21) Appl. No.: 17/750,413

(22) Filed: May 23, 2022

(65) Prior Publication Data

US 2022/0416181 A1 Dec. 29, 2022

(30) Foreign Application Priority Data

Jun. 23, 2021 (CN) .......................... 202110699123.9

(51) Int. Cl.
*B32B 3/08* (2006.01)
*B32B 3/10* (2006.01)

(52) U.S. Cl.
CPC .................. *B32B 3/08* (2013.01); *B32B 3/10* (2013.01); *B32B 2250/05* (2013.01); *B32B 2457/20* (2013.01)

(58) Field of Classification Search
CPC ......... B32B 3/08; B32B 3/10; B32B 2250/05; B32B 2457/20

USPC ....................................................... 428/195.1
See application file for complete search history.

(56) References Cited

U.S. PATENT DOCUMENTS

| | | | |
|---|---|---|---|
| 2012/0038032 A1 | 2/2012 | Dekker | |
| 2018/0035553 A1* | 2/2018 | Liu | H05K 1/028 |
| 2018/0102072 A1* | 4/2018 | Lee | G06F 1/1652 |
| 2021/0026420 A1* | 1/2021 | Zhang | B32B 7/12 |
| 2022/0416181 A1* | 12/2022 | Wu | B32B 3/10 |

FOREIGN PATENT DOCUMENTS

| | | |
|---|---|---|
| CN | 107342018 A | 11/2017 |
| TW | 201743304 A | 12/2017 |

* cited by examiner

*Primary Examiner* — Betelhem Shewareged
(74) *Attorney, Agent, or Firm* — Winston Hsu

(57) ABSTRACT

A rollable display device is provided by the present disclosure. The rollable display device includes a substrate, a display element, a circuit element and a supporting layer. The substrate has a bending portion and a rollable portion. The display element is disposed on the rollable portion. The circuit element is disposed on the bending portion and electrically connected to the display element. The supporting layer is disposed under the substrate, wherein the rollable portion is attached by the supporting layer, and at least a part of the bending portion is not attached by the supporting layer.

6 Claims, 12 Drawing Sheets

ROLLABLE DISPLAY DEVICE

BACKGROUND OF THE DISCLOSURE

1. Field of the Disclosure

The present disclosure relates to a rollable display device, and more particularly to a rollable display device capable of being folded or expanded.

2. Description of the Prior Art

Recently, rollable display devices have become one of the topics in the field of display devices. As demands of the users to rollable display devices are getting higher, the flexibility of rollable display devices should further be improved in order to improve the using experience of the rollable display devices. However, when current rollable display devices are folded or expanded, the generated stress may damage the devices, thereby reducing the lifespan of the rollable display devices. Therefore, to improve the flexibility of the rollable display devices or reducing the stress generated when the rollable display devices are being folded or expanded is still an important issue in the related field.

SUMMARY OF THE DISCLOSURE

In order to solve the above-mentioned problem, in some embodiments, a rollable display device is provided by the present disclosure. The rollable display device includes a substrate, a display element, a circuit element and a supporting layer. The substrate has a bending portion and a rollable portion. The display element is disposed on the rollable portion. The circuit element is disposed on the bending portion and electrically connected to the display element. The supporting layer is disposed under the substrate, wherein the rollable portion is attached by the supporting layer, and at least a part of the bending portion is not attached by the supporting layer.

These and other objectives of the present disclosure will no doubt become obvious to those of ordinary skill in the art after reading the following detailed description of the embodiment that is illustrated in the various figures and drawings.

DETAILED DESCRIPTION

The present disclosure may be understood by reference to the following detailed description, taken in conjunction with the drawings as described below. It is noted that, for purposes of illustrative clarity and being easily understood by the readers, various drawings of this disclosure show a portion of the electronic device, and certain elements in various drawings may not be drawn to scale. In addition, the number and dimension of each element shown in drawings are only illustrative and are not intended to limit the scope of the present disclosure.

Certain terms are used throughout the description and following claims to refer to particular elements. As one skilled in the art will understand, electronic equipment manufacturers may refer to an element by different names. This document does not intend to distinguish between elements that differ in name but not function.

In the following description and in the claims, the terms "include", "comprise" and "have" are used in an open-ended fashion, and thus should be interpreted to mean "include, but not limited to . . . ".

It will be understood that when an element or layer is referred to as being "disposed on" or "connected to" another element or layer, it can be directly on or directly connected to the other element or layer, or intervening elements or layers may be presented (indirectly). In contrast, when an element is referred to as being "directly on" or "directly connected to" another element or layer, there are no intervening elements or layers presented. In addition, the term "electrical connection" may be a direct electrical connection or an indirect electrical connection through other elements.

The terms "approximately", "equal to", "equal" or "the same", "substantially" or "approximately" are generally interpreted as being within ±20% of the given value, or interpreted as being within ±10%, ±5%, ±3%, ±2%, ±1% or ±0.5% of the given value.

Although terms such as first, second, third, etc., may be used to describe diverse constituent elements, such constituent elements are not limited by the terms. The terms are used only to discriminate a constituent element from other constituent elements in the specification. The claims may not use the same terms, but instead may use the terms first, second, third, etc. with respect to the order in which an element is claimed. Accordingly, in the following description, a first constituent element may be a second constituent element in a claim.

It should be noted that the technical features in different embodiments described in the following can be replaced, recombined, or mixed with one another to constitute another embodiment without departing from the spirit of the present disclosure.

Figure 1:
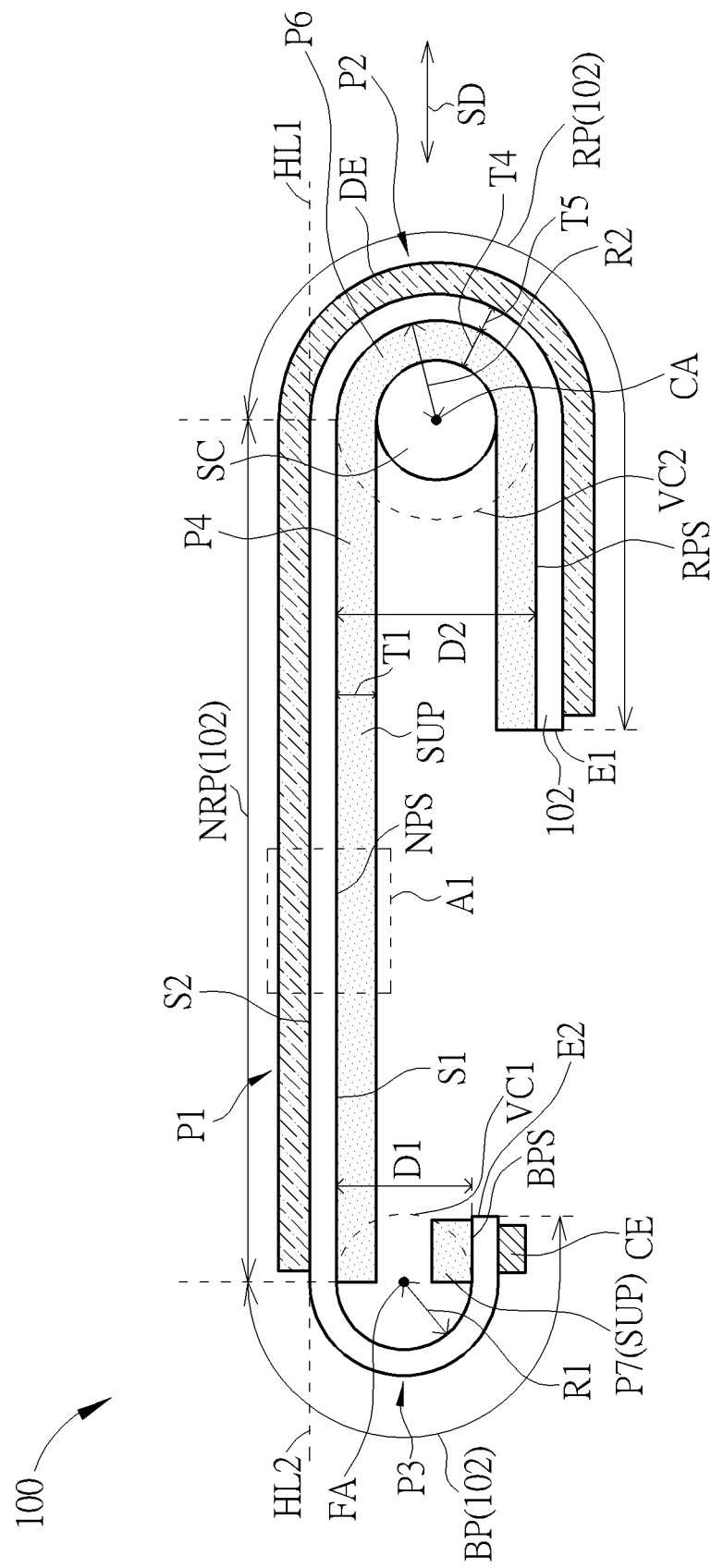
FIG. 1 schematically illustrates a cross-sectional view of an electronic device according to a first embodiment of the present disclosure.
Figure 2:
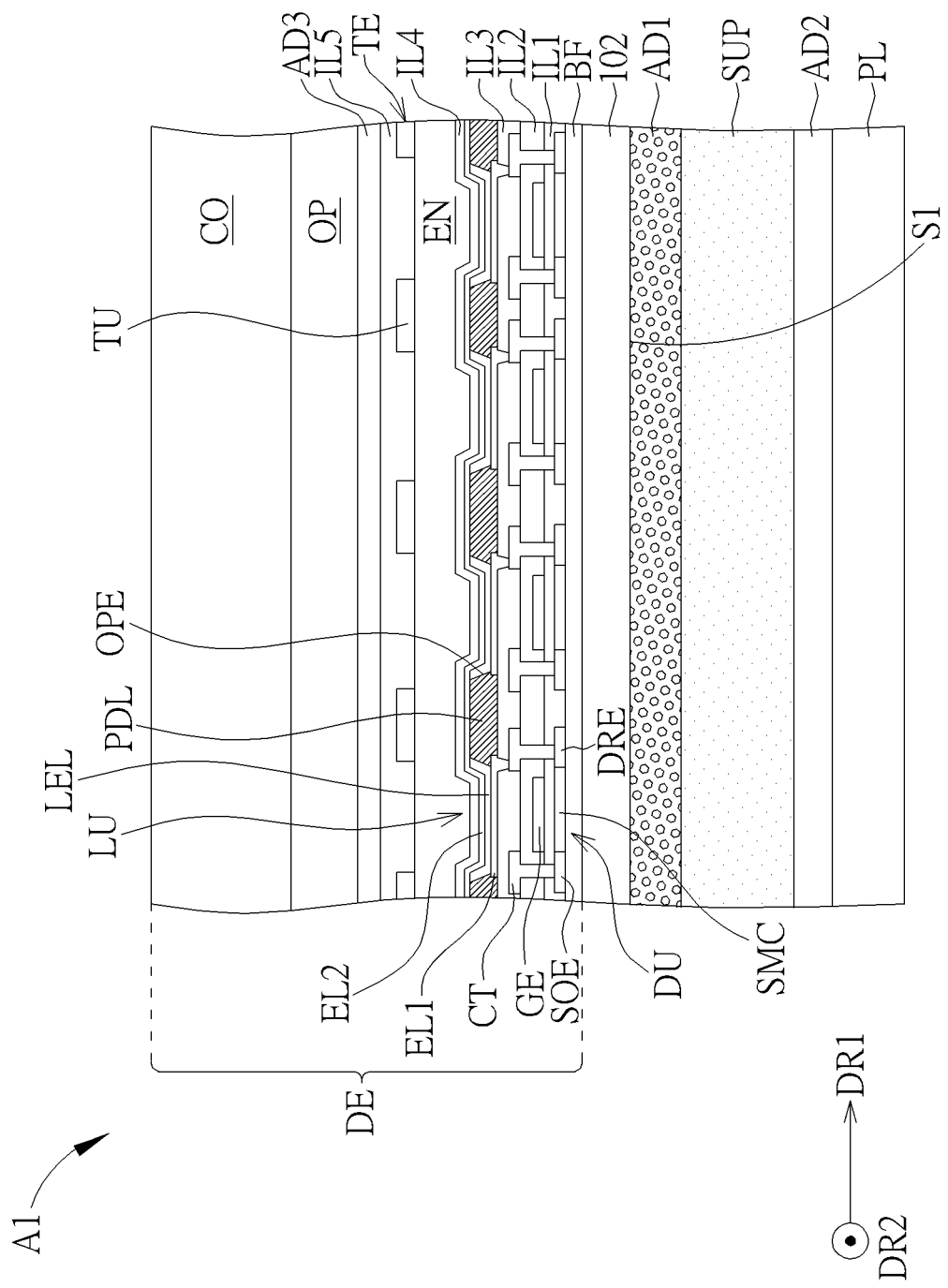
FIG. 2 schematically illustrates a partial enlarged view of the electronic device shown in FIG. 1.

Referring to FIG. 1 and FIG. 2, FIG. 1 schematically illustrates a cross-sectional view of an electronic device according to a first embodiment of the present disclosure, and FIG. 2 schematically illustrates a partial enlarged view of the electronic device shown in FIG. 1. For example, FIG. 2 shows the partial enlarged view of the portion A1 shown in FIG. 1, but not limited thereto. According to the present disclosure, the electronic device shown in FIG. 1 and FIG.

2 may include a rollable display device 100 that can display static or dynamic images or screens according to the demands and operations of users, but not limited thereto. The rollable display device 100 may for example be applied to laptops, common displays, tiled displays, vehicle displays, touch displays, television, surveillance cameras, smart phones, tablets, light source modules, light emitting devices or electronic devices of the above-mentioned products, but not limited thereto. In addition, in the present disclosure, the rollable display device 100 may for example include a rollable display panel or an extending display panel that can be expanded (or called "unfolded") and/or folded (or called "closed") by being rolled by the users, but not limited thereto.

According to the present embodiment, as shown in FIG. 1, the rollable display device 100 may include a substrate 102, a display element DE, a circuit element CE and a supporting layer SUP, but not limited thereto. The substrate 102 includes a bending portion BP and a rollable portion RP. The substrate 102 includes a lower surface S1 and an upper surface S2 opposite to the lower surface S1. The display element DE may be disposed on the rollable portion RP. Specifically, the display element DE may be disposed on the upper surface S2 of the rollable portion RP of the substrate 102. The circuit element CE may be disposed on the bending portion BP and electrically connected to the display element DE. The supporting layer SUP may be disposed under the substrate 102. Specifically, the supporting layer SUP may be disposed on the lower surface S1 of the substrate 102. The rollable portion RP is attached by the supporting layer SUP, and at least a part of the bending portion BP is not attached by the supporting layer SUP. The elements and/or layers included in the rollable display device 100 will be detailed in the following. According to some embodiments, the attachment may be performed through adhesive, static electricity or the combination of the above-mentioned methods.

In the present embodiment, the sides of the substrate 102 may for example extend along a first direction DR1 and a second direction DR2, but not limited thereto. The substrate 102 may include a flexible substrate, or at least a part of the substrate 102 is flexible substrate, but not limited thereto. The material of the flexible substrate may include plastics, such as polyimide (PI), polycarbonate (PC), polyethylene terephthalate (PET), other suitable materials or the combinations of the above-mentioned materials. In addition, although the substrate 102 in FIG. 1 is shown as a single layer, the present embodiment is not limited thereto. In some embodiments, the substrate 102 may include a multi-layer structure.

As shown in FIG. 1, the rollable display device 100 may for example include a scroll SC, wherein the scroll SC may include a central axis CA. When the scroll SC is moving along an expanding-folding direction SD, the rolling degree of the portion P2 of the rollable display device 100 may be varied according to the movement of the scroll SC, such that the rollable display device 100 can be folded and/or expanded. The portion P1 of the rollable display device 100 may be flat during the folding process or the expanding process of the rollable display device 100, and the first portion P1 is not rolled or the rolling degree of the first portion P1 is not changed due to the movement of the scroll SC. In the present embodiment, the portion P3 of the rollable display device 100 may be bent backward to the rear surface of the rollable display device 100. That is, the portion P3 is bent toward the lower surface S1 of the substrate 102, but not limited thereto. The portion P3 of the rollable display device 100 may for example be the portion of the rollable display device 100 that does not display image and can be used for disposition of peripheral elements (such as the circuit element CE).

According to the present embodiment, the substrate 102 may further include a non-rollable portion NRP disposed between the bending portion BP and the rollable portion RP. The non-rollable portion NRP is not attached by the supporting layer SUP. In detail, the rollable portion RP of the substrate 102 may be the portion of the substrate 102 that can be rolled or whose rolling degree can be changed due to folding or expanding of the rollable display device 100. In other words, when the scroll SC is moving along the expanding-folding direction SD, the rollable portion RP of the substrate 102 may be rolled or expanded, and the part of the rollable portion RP being rolled may be varied according to the expanding degree of the rollable display device 100. The rollable portion RP of the substrate 102 may substantially correspond to the portion P2 of the rollable display device 100. The bending portion BP of the substrate 102 may be the portion of the substrate 102 being bent to the back side (that is, the side of the lower surface S1 of the substrate 102) of the rollable display device 100 and fixed, and the rolling degree or bending degree of the bending portion BP of the substrate 102 would not be changed during the folding process or the expanding process of the rollable display device 100. The bending portion BP of the substrate 102 may substantially correspond to the portion P3 of the rollable display device 100. The non-rollable portion NRP of the substrate 102 may be the portion of the substrate 102 which is substantially flat. In other words, the non-rollable portion NRP may be the portion of the substrate 102 not being rolled due to the movement of the scroll SC, in addition to the bending portion BP. According to the present embodiment, the non-rollable portion NRP of the substrate 102 may for example be the portion of the substrate 102 other than the rollable portion RP and the bending portion BP, but not limited thereto. The non-rollable portion NRP of the substrate 102 may substantially correspond to the portion P1 of the rollable display device 100.

In the present embodiment, the ranges of the bending portion BP, the non-rollable portion NRP and the rollable portion RP may for example be defined under the state that the rollable display device 100 is completely folded or closed (or completely non-expanded). In detail, the rollable display device 100 shown in FIG. 1 may be in a completely non-expanded state, and in such state, the portion of the substrate 102 starting from the position at which a part of the substrate 102 close to the scroll SC starts to be rolled (in other words, the part starts to deviate from the horizontal extending line HL1 parallel to the first direction DR1) to a first end E1 of the substrate 102 close to the scroll SC may be defined as the rollable portion RP of the substrate 102. The portion of the substrate 102 starting from the position at which a part of the substrate 102 away from the scroll SC starts to be bent (in other words, the part starts to deviate from the horizontal extending line HL2 parallel to the first direction DR1) to a second end E2 of the substrate 102 away from the scroll SC may be defined as the bending portion BP of the substrate 102. The non-rollable portion NRP of the substrate 102 may be defined as the portion of the substrate 102 other than the bending portion BP and the rollable portion RP or the portion between the bending portion BP and the rollable portion RP, but not limited thereto. The first direction DR1 mentioned above may for example be parallel to the extending direction of the rollable display device 100 or the expanding-folding direction SD, but not limited thereto. It should be noted that the definitions of the bending portion BP, the non-rollable portion NRP and the rollable portion RP mentioned above are just exemplary, and the present disclosure is not limited thereto. In addition, the rollable display device 100 may include a containing element disposed corresponding to the rollable portion RP in some embodiments. When the rollable display device 100 is not completely expanded, the containing element may be used to contain the non-expanded portion (that is, the part of the rollable portion RP that is not expanded) of the rollable display device 100, but not limited thereto.

According to the present embodiment, the display region (not shown) of the rollable display device 100 may substantially correspond to the region in which the display element DE is disposed, and the peripheral region of the rollable display device 100 may for example be defined as the region of the rollable display device 100 other than the display region, but not limited thereto. Accordingly, the non-rollable portion NRP and the rollable portion RP with the display element DE disposed thereon may for example correspond to the display region of the rollable display device 100, and the bending portion BP with no display element DE disposed thereon may correspond to the peripheral region of the rollable display device 100, but not limited thereto. Moreover, since the display region of the rollable display device 100 may partially correspond to the rollable portion RP of the substrate 102, the size of the display region for displaying images may be adjusted by changing the folding degree or expanding degree of the rollable display device 100, according to the demands of the users. For example, after the rollable display device 100 is expanded, the size of the display region of the rollable display device 100 for displaying images may be increased.

According to the present embodiment, the display element DE may for example include any suitable light emitting element and driving element for driving the light emitting element. In order to simplify the figure, the display element DE in FIG. 1 is shown as a single layer, and the detailed structure of the display element DE may refer to the structure shown in FIG. 2. The display element DE may for example include self-luminous elements or non-self-luminous elements, but not limited thereto. The self-luminous element may for example include an organic light emitting diode (OLED), a quantum dot light emitting diode (QLED), a light emitting diode (LED), other suitable light emitting elements or the combinations of the above-mentioned materials. The light emitting diode may for example include a mini light emitting diode (mini LED) or a micro light emitting diode (micro LED), but not limited thereto. In an embodiment, the chip size of the light emitting diode may range from 300 micrometers (μm) to 10 millimeters (mm), the chip size of the mini light emitting diode may range from 100 micrometers to 300 micrometers, and the chip size of the micro light emitting diode may range from 1 micrometer to 100 micrometers, but not limited thereto. In some embodiments, when the display element DE includes non-self-luminous elements, it may for example include liquid crystal units and pixel electrodes for controlling the rotation of liquid crystal molecules, but not limited thereto. The display element DE including organic light emitting diode elements is taken as an example for description in the following content and FIG. 2, but the display element DE of the present embodiment is not limited thereto.

As shown in FIG. 2, the display element DE may include at least one light emitting unit LU, wherein the light emitting unit LU may include a first electrode EL1, a second electrode EL2 and a light emitting layer LEL disposed between the first electrode EL1 and the second electrode EL2. The first electrode EL1 and the second electrode EL2 may respectively serve as anode and cathode of the light emitting unit LU, but not limited thereto. The first electrode EL1 and the second electrode EL2 may for example include metal oxides, metal materials, other suitable conductive materials or the combinations of the above-mentioned materials. For example, the first electrode EL1 may include metal materials, and the second electrode EL2 may include transparent conductive materials such as indium tin oxide (ITO), but not limited thereto. In addition, the display element DE may further include at least one driving unit DU, wherein the driving unit DU may for example include a thin film transistor having a gate GE, a source SOE, a drain DRE, a semiconductor layer SMC and an insulating layer IL1, and the insulating layer IL1 may be located between the gate GE and the semiconductor layer SMC. According to the present embodiment, the driving unit DU may be electrically connected to the light emitting unit LU, such that the driving unit DU can drive the light emitting unit LU to emit light. For example, as shown in FIG. 2, the drain DRE of the driving unit DU may for example be electrically connected to the first electrode EL1 of the light emitting unit LU through a contact element CT, but not limited thereto. The thin film transistors shown in FIG. 2 are just exemplary, and the present disclosure is not limited thereto. The driving unit DU may include a top gate thin film transistor, a bottom gate thin film transistor or the combination of the above-mentioned thin film transistors.

As shown in FIG. 2, the display element DE may further include a pixel defining layer PDL disposed between the light emitting layer LEL in some embodiments, wherein the pixel defining layer PDL may include at least one opening OPE, and the light emitting layer LEL may be disposed in the opening OPE. The display element DE may further include a buffer layer BF, an optical layer OP and a cover layer CO, but not limited thereto. The buffer layer BF may be disposed on the substrate 102 and include any suitable buffer material. The driving unit DU may be disposed on the buffer layer BF. The optical layer OP may be disposed on the light emitting unit LU. The optical layer OP may for example include a polarizer, an antireflection layer or the combination of the above-mentioned elements, but not limited thereto. The cover layer CO may be disposed on the optical layer OP to protect the layers or elements in the rollable display device 100, wherein the cover layer CO may for example include glass, plastics, polymers, other suitable protecting materials or the combinations of the above-mentioned materials, but not limited thereto. In some embodiments, the display element DE may further include a touch layer TE disposed on the light emitting unit LU. The touch layer TE may include a plurality of touch electrodes TU to provide the touch function of the rollable display device 100, but not limited thereto. For ease of explanation, the touch layer TE in FIG. 2 is shown as a single layer. According to some embodiments, the touch layer TE may be a multi-layer structure, such as a two-layer structure. The material of the touch electrodes TU may include metal conductive materials, transparent conductive materials or the combinations of the above-mentioned materials. As shown in FIG. 2, the display element DE may further include an insulating layer IL2 and an insulating layer IL3 disposed on the insulating layer IL1, an insulating layer IL4 disposed on the second electrode EL2, an insulating layer EN disposed on the insulating layer IL4 and an insulating layer IL5 disposed on the touch layer TE, but not limited thereto. In some embodiments, as shown in FIG. 2, the display element DE may further include a third adhesion layer AD3, and the optical layer OP may be attached to the insulating layer IL5 on the touch layer TE through the third adhesion layer AD3, but not limited thereto.

In the present embodiment, the circuit element CE may include any active element and/or passive element suitable to be applied to the rollable display device 100. Specifically, the circuit element CE may include driving element formed through a thin film process (such as a gate driving circuit), flexible printed circuit board (FPCB), printed circuit board (PCB), chip on film (COF), integrated circuit (IC) or the combinations of the above-mentioned elements, but not limited thereto. As shown in FIG. 1, since the display element DE is not disposed on the bending portion BP of the substrate 102 in the present embodiment, the bending portion BP may be bent backward to the rear surface of the rollable display device 100 and fixed. Therefore, the effect of narrow border or increasing the screen-to-body ratio may be achieved.

As shown in FIG. 1, the bending portion BP may for example be folded or bent along a folding axis FA, but not limited thereto. As shown in FIG. 1, the bending status of the bending portion BP means that different parts of a same surface of the substrate 102 in the bending portion BP are bent to be parallel to each other. In detail, in the lower surface S1 of the substrate 102, the surface portion NPS corresponding to the non-rollable portion NRP and the surface portion BPS corresponding to the bending portion BP and close to the second end E2 may substantially be parallel to each other, but not limited thereto. In such condition, a virtual circle VC1 may be defined through a surface of the bending portion BP of the substrate 102 close to the folding axis FA, that is, the inner surface of the bending portion BP. The virtual circle VC1 may be tangent to the surface portion NPS and the surface portion BPS, and the virtual circle VC1 may include a center. The radius R1 of the virtual circle VC1 may be defined as the radius of curvature of the bending portion BP. The center of the virtual circle VC1 may for example overlap the folding axis FA in the present embodiment, but not limited thereto. The radius of curvature of the bending portion BP of the substrate 102 may be defined through the above-mentioned method.

As shown in FIG. 1, the rollable portion RP may for example be folded or bent along the central axis CA of the scroll SC, but not limited thereto. Similarly, the bending state of the rollable portion RP means that different parts of a same surface of the substrate 102 in the rollable portion RP are bent to be parallel to each other. In detail, in the lower surface S1 of the substrate 102, the surface portion NPS corresponding to the non-rollable portion NRP and the surface portion RPS corresponding to the rollable portion RP and close to the first end E1 may substantially be parallel to each other, but not limited thereto. In such condition, a virtual circle VC2 may be defined through a surface of the rollable portion RP of the substrate 102 close to the central axis CA, that is, the inner surface of the rollable portion RP. The virtual circle VC2 may be tangent to the surface portion NPS and the surface portion RPS, and the virtual circle VC2 may include a center. The radius R2 of the virtual circle VC2 may be defined as the radius of curvature of the rollable portion RP. The center of the virtual circle VC2 may for example overlap the central axis CA of the scroll SC, but not limited thereto. The radius of curvature of the rollable portion RP of the substrate 102 may be defined through the above-mentioned method.

After the radiuses of curvature are defined, the curvatures (reciprocal of radius of curvature) of the bending portion BP and the rollable portion RP may further be defined. In some embodiments, the curvatures of the bending portion BP and the rollable portion RP may be confirmed through observation by naked eyes or a microscope. It should be noted that the definitions of the radius of curvature R1 of the bending portion BP and the radius of curvature R2 of the rollable portion RP are not limited to the above-mentioned content. In some embodiments, when the virtual circle VC1 of the bending portion BP and the virtual circle VC2 of the rollable portion RP are difficult to be defined (for example, the bending portion BP and the rollable portion RP include irregular shapes when they are folded), the radius of curvature of the bending portion BP and the radius of curvature of the rollable portion RP may respectively be defined by measuring the distance between two parts of a same surface of the substrate 102 which are facing each other and parallel to each other in the bending portion BP and the rollable portion RP, but not limited thereto. In detail, as shown in FIG. 1, in the bending portion BP, the distance D1 between the surface portion BPS and the surface portion NPS which are facing each other and parallel to each other may be measured, wherein the radius of curvature R1 of the bending portion BP may be half of the distance D1 (that is, D1=2*R1). Similarly, in the rollable portion RP, the distance D2 between the surface portion RPS and the surface portion NPS which are facing each other and parallel to each other may be measured, wherein the radius of curvature R2 of the rollable portion RP may be half of the distance D2 (that is, D2=2*R2), but not limited thereto. The definitions of the curvatures and radiuses of curvature of the bending portion BP and the rollable portion RP mentioned above may be applied to each of the embodiments of the present disclosure, and will not be redundantly described.

According to the present embodiment, when the radius of curvature R1 of the bending portion BP is reduced, the effect of narrow border of the rollable display device 100 may be improved, or the screen-to-body ratio of the rollable display device 100 may be increased. When the radius of curvature R2 of the rollable portion RP is reduced, the thickness of the entire rollable display device 100 may be reduced, thereby reducing the size of the product. Therefore, the performance of the rollable display device 100 may be improved by reducing the radius of curvature R1 and the radius of curvature R2 in the present embodiment. In addition, since the bending portion BP is fixed after it is being bent, and the rollable portion RP can be continuously rolled when the rollable display device 100 is being folded or expanded, the stress endured by the rollable portion RP may be greater than the stress endured by the bending portion BP when the rollable display device 100 is being used. Accordingly, as shown in FIG. 1, the radius of curvature R1 of the bending portion BP may for example be designed to be lower than the radius of curvature R2 of the rollable portion RP in the present embodiment. That is, the curvature of the bending portion BP may be greater than the curvature of the rollable portion RP. Therefore, the rollable portion RP is capable of enduring greater stress, and the possibility that the rollable portion RP or the display element DE corresponding to the rollable portion RP is damaged during the folding/expanding process of the rollable display device 100 may be reduced. The relationships between the radiuses of curvature (or curvatures) of the bending portion BP and the rollable portion RP may be applied to each of the embodiments of the present disclosure, and will not be redundantly described in the following.

The supporting layer SUP disposed on the lower surface S1 of the substrate 102 may provide the rollable display device 100 with the supporting effect. In some embodiments, the material of the supporting layer SUP may be the same as the material of the substrate 102, which may refer to the description about the material of the substrate 102 mentioned above, but not limited thereto. According to some embodiments, at least a part of the bending portion BP is not attached by the supporting layer SUP. As shown in FIG. 1, a portion P7 of the supporting layer SUP is attached to the bending portion BP and close to the second end E2, and the supporting layer SUP is not attached to the remaining part of the bending portion BP. According to some embodiments, although it is not shown in the figure, the portion of the supporting layer SUP corresponding to the bending portion BP may be completely removed. That is, the supporting layer SUP may not be attached to the bending portion BP.

As shown in FIG. 1, the portion of the supporting layer SUP attached to the non-rollable portion NRP (that is, the first portion P4 shown in FIG. 1) may have a thickness T1. According to some embodiments, the radius of curvature R1 of the bending portion BP of the substrate 102 may be less than 20 times the thickness T1 of the first portion P4. According to some embodiments, the radius of curvature R2 of the rollable portion RP of the substrate 102 may be greater than or equal to 20 times the thickness T1 of the first portion P4. According to some embodiments, the supporting layer SUP may not be attached to the bending portion BP or the rollable portion RP, such that the influence of the supporting layer SUP on the flexibility of the bending portion BP and the rollable portion RP may be reduced, but not limited thereto. For example, the thickness T1 of the portion of the supporting layer SUP corresponding to the non-rollable portion NRP may for example range from 50 micrometers (μm) to 100 micrometers (that is, 50 μm≤thickness T≤100 μm) in the present embodiment, and when the thickness T1 is 50 micrometers, the radius of curvature R1 of the bending portion BP may for example be less than 1000 micrometers (that is, radius of curvature R1<1000 μm), and the radius of curvature R2 of the rollable portion RP may for example be greater than or equal to 1000 micrometers (that is, 1000 μm≤radius of curvature R2), but not limited thereto. In the present disclosure, the thickness of each layer may be measured at the position at least 10 micrometers away from the edge of the layer to be measured. The thickness measurement may be performed on the layers such as the supporting layer, the substrate, the first organic layer, the second organic layer, the inorganic layer and the like at the above-mentioned position, but not limited thereto.

According to the present embodiment, since the supporting layer SUP may be attached to the non-rollable portion NRP, the supporting layer SUP may provide the non-rollable portion NRP and the portion of the display element DE disposed on and corresponding to the non-rollable portion NRP with the supporting effect. The non-rollable portion NRP of the substrate 102 may substantially be flat, which would not be folded or bent due to folding or expanding of the rollable display device 100. According to some embodiments, the supporting layer SUP may be attached to the rollable portion RP to provide the supporting effect, thereby reducing the possibility that the rollable portion RP and the portion of the display element DE disposed on and corresponding to the rollable portion RP are damaged during the folding process or the expanding process of the rollable display device 100. In addition, according to some embodiments, the radius of curvature R2 of the rollable portion RP may be designed to be greater than or equal to 20 times the thickness T1 of the portion of the supporting layer SUP corresponding to the non-rollable portion NRP, such that the influence of the supporting layer SUP on the flexibility of the rollable portion RP may be reduced, thereby improving the using experience of the rollable display device 100. According to some embodiments, the bending portion BP may be bent to the rear surface of the rollable display device 100 to increase the screen-to-body ratio of the rollable display device 100, and the flexibility of the bending portion BP may be improved by making at least a part of the bending portion BP not attached by the supporting layer SUP. In addition, according to some embodiments, since the supporting layer SUP is not attached to the bending portion BP, the radius of curvature R1 of the bending portion BP may be less than 20 times the thickness T1 of the portion of the supporting layer SUP corresponding to the non-rollable portion NRP, such that the radius of curvature R1 of the bending portion BP may be reduced, and the screen-to-body ratio of the rollable display device 100 may be increased. Therefore, through the designs of the supporting layer SUP in different portions of the substrate 102 and the numerical design of the radius of curvature R1 of the bending portion BP and the radius of curvature R2 of the rollable portion RP, the support or flexibility of different portions of the substrate 102 may be improved, thereby improving the yield or using experience of the rollable display device 100.

As shown in FIG. 2, the rollable display device 100 may further include a first adhesion layer AD1, a second adhesion layer AD2 and a supporting plate PL in addition to the above-mentioned elements and layers, but not limited thereto. The supporting plate PL may be disposed under the supporting layer SUP, and the supporting plate PL may for example include a metal plate, wherein the metal plate may include any suitable metal material, but not limited thereto. The first adhesion layer AD1 and the second adhesion layer AD2 may include any suitable adhesive, wherein the second adhesion layer AD2 may be used to attach the supporting plate PL to the supporting layer SUP, and the first adhesion layer AD1 may be used to attach the supporting layer SUP to the substrate 102, but not limited thereto. In some embodiments, the supporting plate PL may be attached to the supporting layer SUP through other methods (such as electrostatic attachment), and the second adhesion layer AD2 may be omitted. In some embodiments, the supporting layer SUP may be attached to the substrate 102 through other methods (such as electrostatic attachment), and the first adhesion layer AD1 may be omitted.

It should be noted that the structure of the rollable display device 100 of the present embodiment is not limited to what is shown in FIG. 1 and FIG. 2. In some embodiments, the rollable display device 100 may further include other suitable elements and/or layers, and the present disclosure is not limited thereto. The manufacturing method of the rollable display device 100 of the present embodiment will be detailed in the following.

Figure 6:
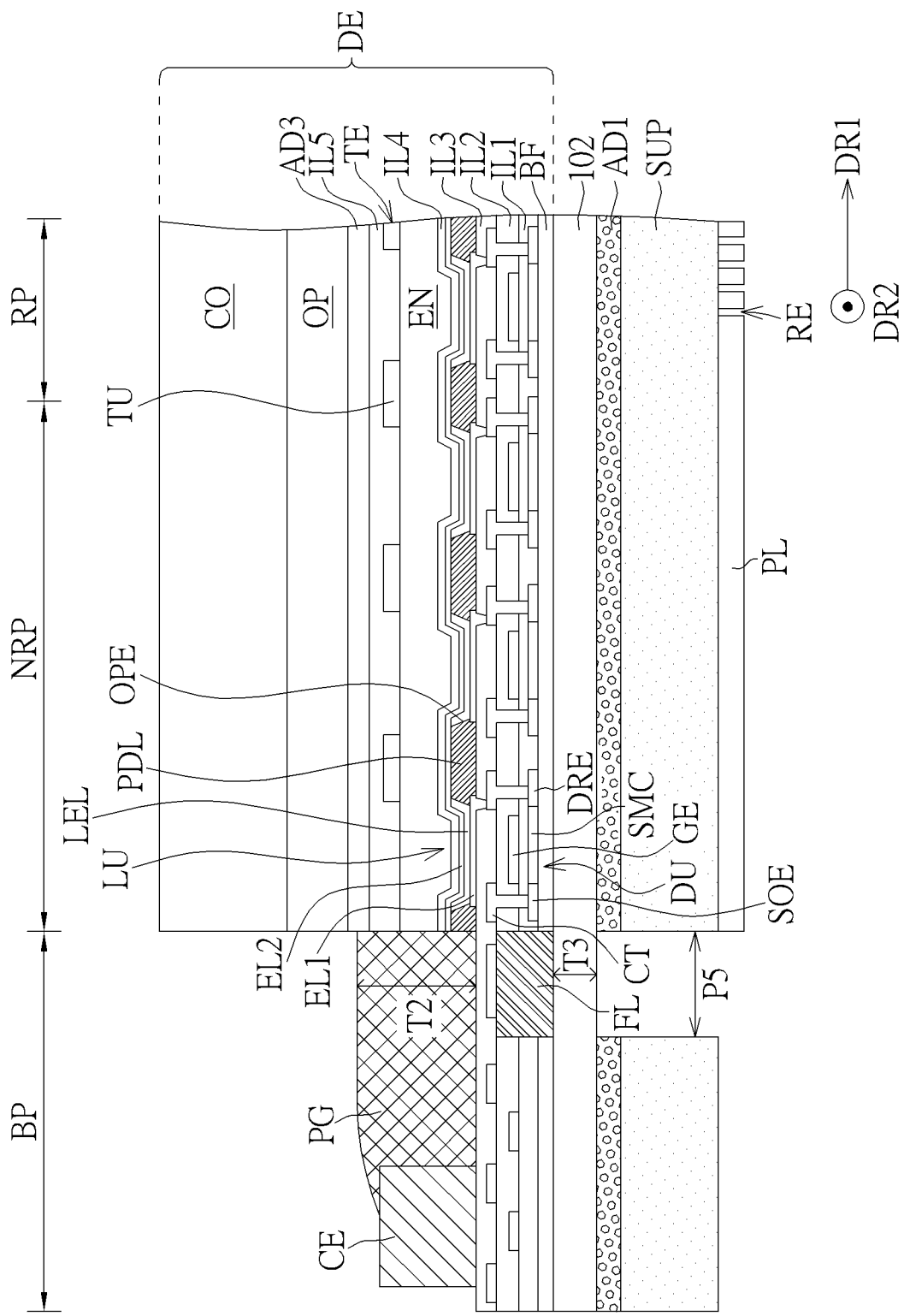
Figure 7:
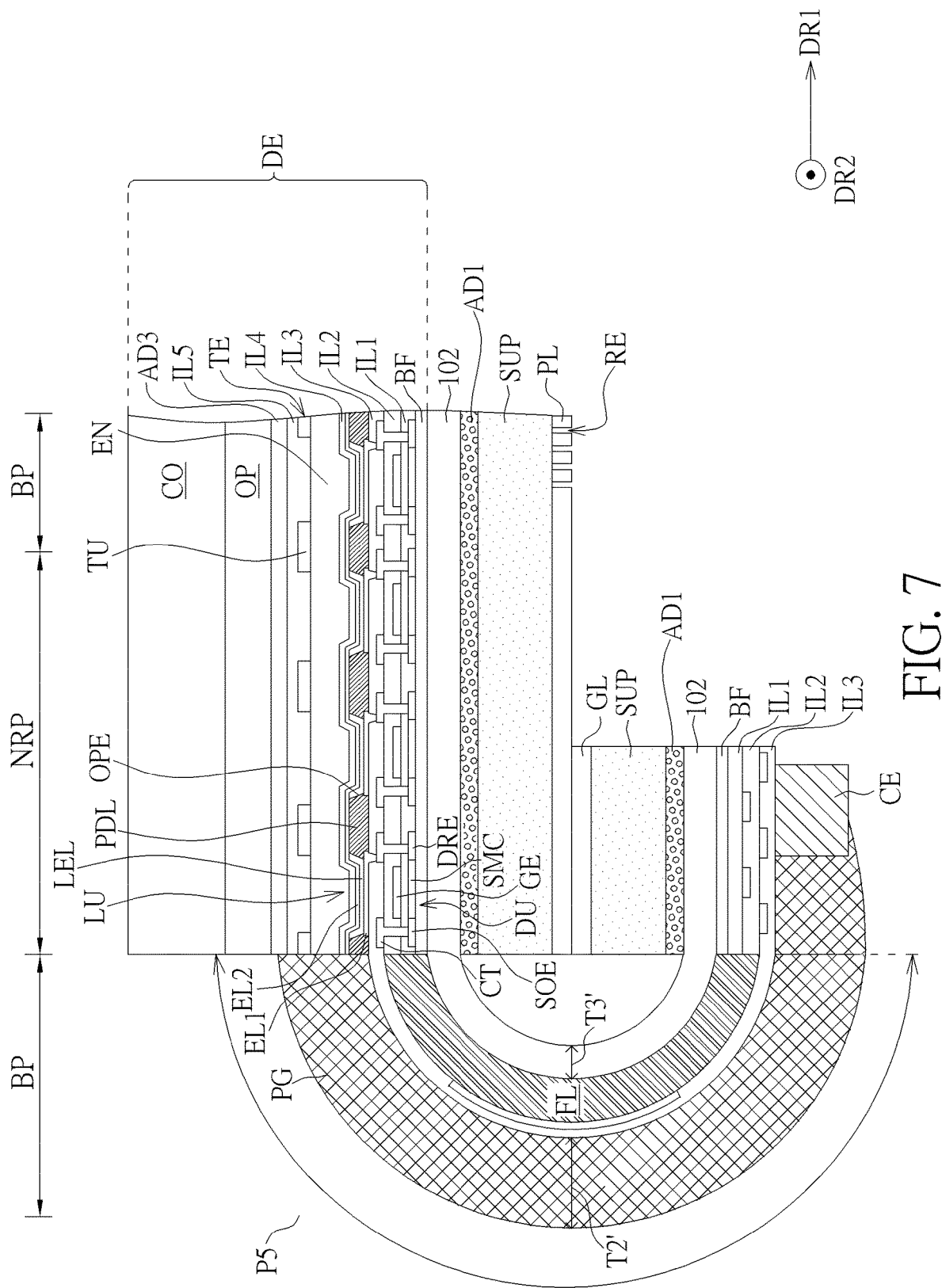
Figure 8:
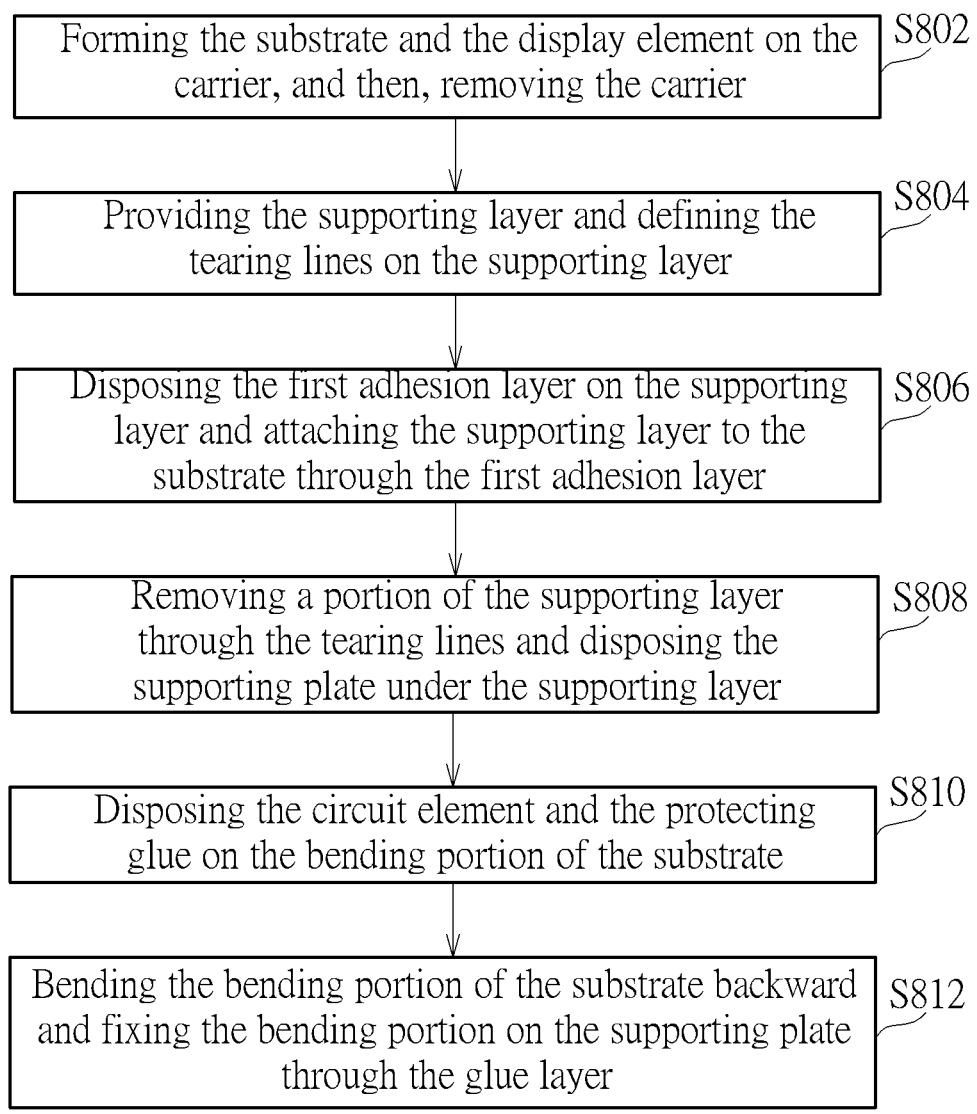
FIG. 8 shows the flow chart of the manufacturing process of the electronic device according to the first embodiment of the present disclosure.

Referring to FIG. 3 to FIG. 8, FIG. 3 to FIG. 7 schematically illustrate the manufacturing process of the electronic device according to the first embodiment of the present disclosure, and FIG. 8 shows the flowchart of the manufacturing process of the electronic device according to the first embodiment of the present disclosure. According to the present embodiment, as shown in FIG. 8, the manufacturing method 800 of the rollable display device 100 may include the following steps.

S802: forming the substrate and the display element on the carrier, and then, removing the carrier S804: providing the supporting layer and defining the tearing lines on the supporting layer S806: disposing the first adhesion layer on the supporting layer and attaching the supporting layer to the substrate through the first adhesion layer S808: removing a portion of the supporting layer through the tearing lines and disposing the supporting plate under the supporting layer S810: disposing the circuit element and the protecting glue on the bending portion of the substrate S812: bending the bending portion of the substrate backward and fixing the bending portion on the supporting plate through the glue layer Each step in the manufacturing method 800 will be detailed in the following.

Figure 3:
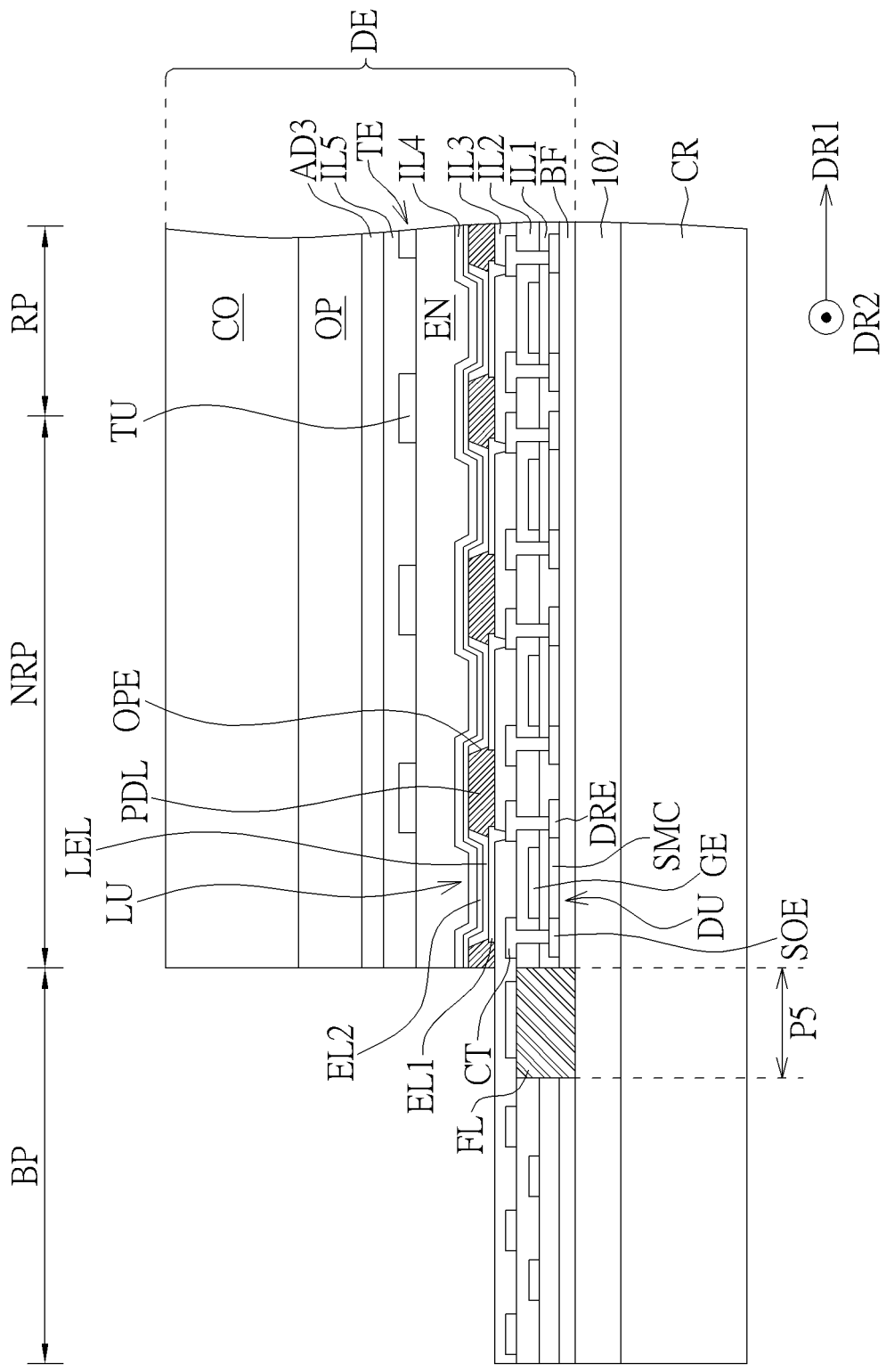
FIG. 3 to FIG. 7 schematically illustrate the manufacturing process of the electronic device according to the first embodiment of the present disclosure.

The manufacturing method 800 of the rollable display device 100 of the present embodiment may firstly include the step S802: forming the substrate 102 and the display element DE on the carrier CR (as shown in FIG. 3), and then removing the carrier CR. It should be noted that, as shown in FIG. 3, a portion of the elements and/or layers of the display element DE may not be disposed corresponding to the bending portion BP of the substrate 102 when forming the display element DE on the substrate 102, that is, the portion of the elements and/or layers of the display element DE may not be disposed on the bending portion BP, thereby improving the flexibility of the bending portion BP. For example, the cover layer CO, the optical layer OP, the touch layer TE and the like of the display element DE may not cover the bending portion BP of the substrate 102 or not be disposed corresponding to the bending portion BP, but not limited thereto. Moreover, the light emitting unit LU and the driving unit DU may not be disposed corresponding to the bending portion BP. For example, the light emitting unit LU is not disposed on the bending portion BP, and the driving unit DU is not disposed on at least a part of the bending portion BP, but not limited thereto. In addition, the portion of the buffer layer BF corresponding to a part of the bending portion BP may be removed and be replaced with the organic material layer FL in the present embodiment, but not limited thereto. In detail, as shown in FIG. 3, the bending portion BP of the substrate 102 may include a part P5, wherein the part P5 may for example be defined as the part of the bending portion BP that is mainly folded or bent. In other words, the part P5 may be the part of the bending portion BP having a greater bending degree. According to the present embodiment, the driving unit DU and the light emitting unit LU may not be disposed on the part P5 of the bending portion BP, the portions of the buffer layer BF, the first insulating layer IL1 and the second insulating layer IL2 corresponding to the part P5 of the bending portion BP may be removed, and the organic material layer FL may be filled into the space formed of the removed layers. The organic material layer FL may include any suitable organic insulating material, but not limited thereto. The flexibility of the material of the organic material layer FL may be greater than the flexibility of the inorganic insulating material of the buffer layer BF. Therefore, the flexibility of the portion of the rollable display device 100 corresponding to the part P5 may be increased, thereby reducing the possibility that the rollable display device 100 is cracked when it is being folded.

Figure 4:
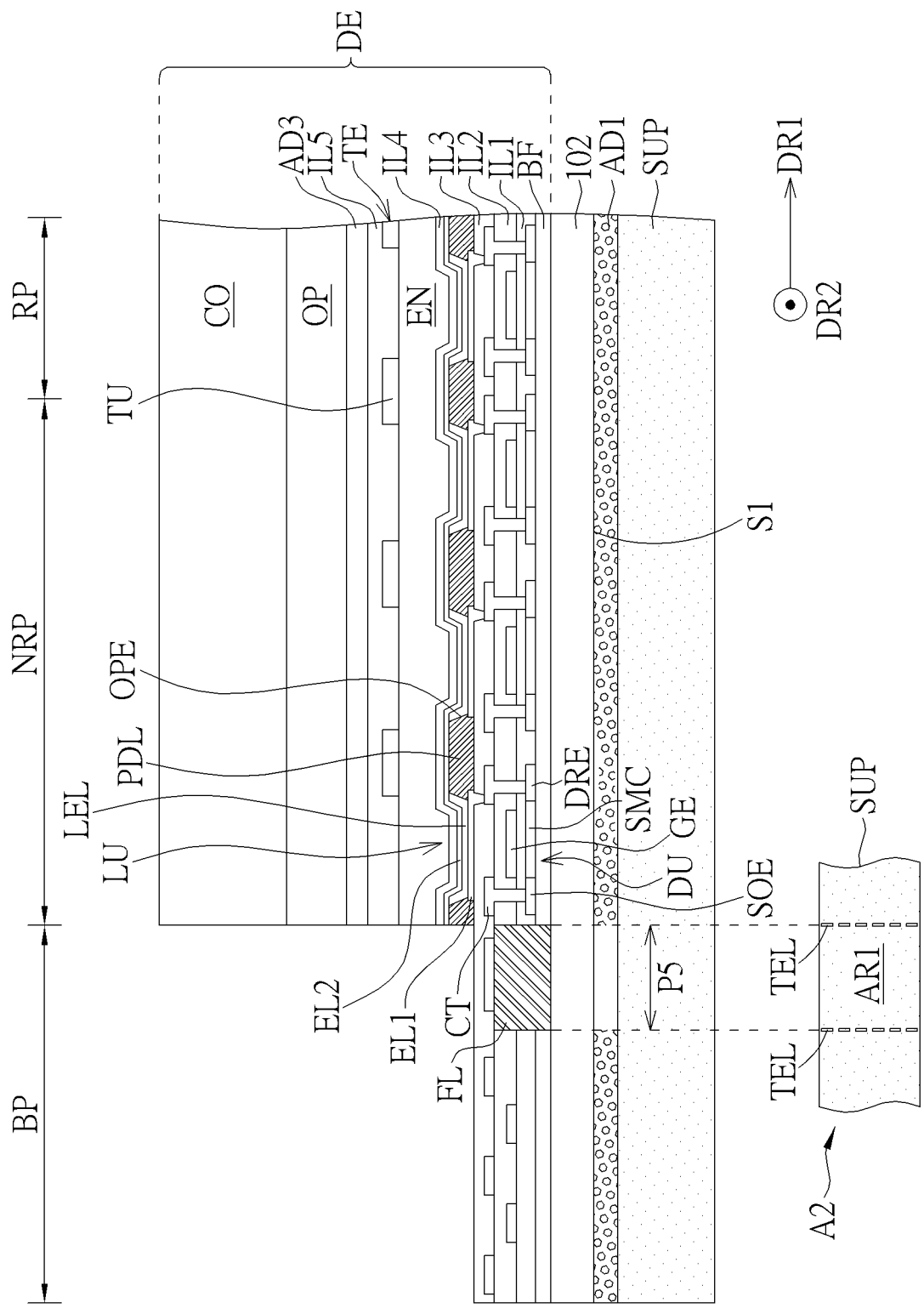

After that, the step S804 may be performed to provide the supporting layer SUP, and tearing lines TEL may be defined on the supporting layer SUP. In detail, as shown in FIG. 4, two tearing lines TEL may be formed on the surface of the supporting layer SUP, wherein the tearing lines TEL are shown in the portion A2 in the lower part of FIG. 4. The portion A2 schematically illustrates a partial bottom view of the supporting layer SUP. The area between the two tearing lines TEL may be defined as the area AR1. According to the present embodiment, the tearing lines TEL on the supporting layer SUP may for example be formed by forming holes on the supporting layer SUP or patterning the supporting layer SUP, but not limited thereto. In addition, the two tearing lines TEL on the supporting layer SUP may for example be formed corresponding to the part P5 of the bending portion BP which is mainly folded or bent, or in other words, the area AR1 between the two tearing lines TEL may substantially correspond to the area of the part P5, but not limited thereto.

After that, the step S806 may be performed to dispose the first adhesion layer AD1 on the supporting layer SUP and attach the supporting layer SUP to the lower surface S1 of the substrate 102 through the first adhesion layer AD1, thereby forming the structure shown in FIG. 4. According to some embodiments, the first adhesion layer AD1 may not be disposed on the area AR1 of the supporting layer SUP between the two tearing lines TEL, but not limited thereto. That is, the part P5 of the bending portion BP which is mainly folded or bent does not correspond to the first adhesion layer AD1.

Figure 5:
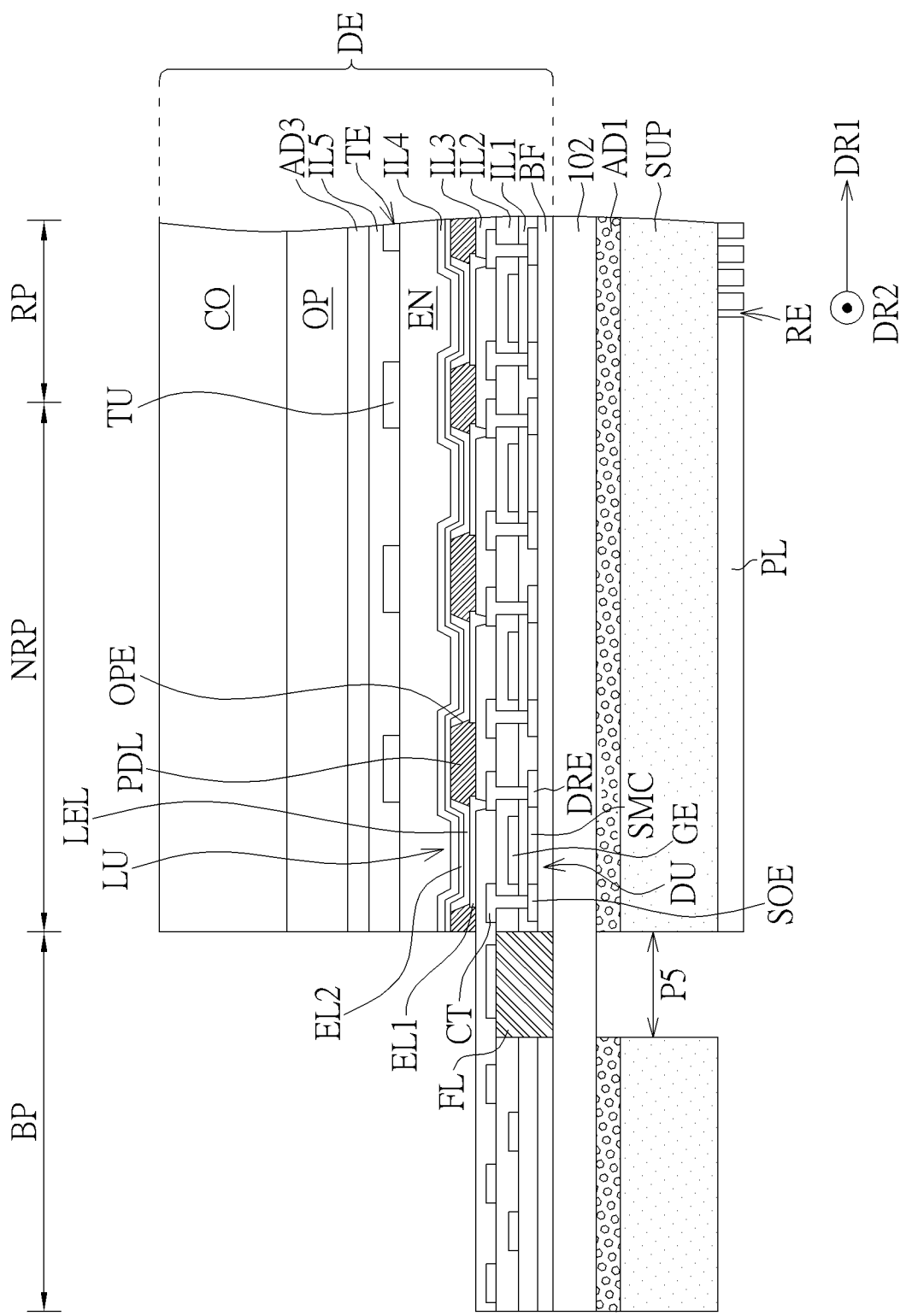

Then, the step S808 may be performed to remove a portion of the supporting layer SUP through the tearing lines TEL and dispose the supporting plate PL under the supporting layer SUP. In detail, as shown in FIG. 5, after the substrate 102 and the display element DE are disposed on the supporting layer SUP, the portion of the supporting layer SUP corresponding to the area AR1 between the two tearing lines TEL may be removed. Since the first adhesion layer AD1 may not be disposed corresponding to the area AR1, a portion of the substrate 102 (or a part of the bending portion BP) may be exposed after the portion of the supporting layer SUP is removed, but not limited thereto. As shown in FIG. 5, after the portion of the supporting layer SUP is removed, at least a part of the bending portion BP does not correspond to the supporting layer SUP, or in other words, at least a part of the bending portion BP is not attached by the supporting layer SUP, but not limited thereto. Generally, since the supporting layer SUP is not attached to all of the portions of the substrate 102, the supporting layer SUP may be divided into a plurality of portions, and a plurality of attachments are required to attach the different portions of the supporting layer SUP to the substrate 102. However, since the positions of the tearing lines TEL on the supporting layer SUP can be defined in advance in the present embodiment, and the portion of the supporting layer SUP to be removed can be defined through the tearing lines TEL, only one attachment is required to attach the supporting layer SUP to the substrate 102, thereby simplifying the process. In addition, compared with the condition that the first adhesion layer AD1 is disposed on the entire supporting layer SUP, since the position of the supporting layer SUP not including the first adhesion layer AD1 can be defined through the tearing lines TEL in the present embodiment, the removing process of the first adhesion layer AD1 may not be performed after the portion of the supporting layer SUP is removed, thereby reducing the possibility of damage of the substrate 102 due to the removing process of the first adhesion layer AD1. According to the present embodiment, the supporting plate PL may be disposed corresponding to the non-rollable portion NRP and the rollable portion RP of the substrate 102, but not the bending portion BP of the substrate 102, but not limited thereto. The flexibility of the bending portion BP may be improved through the above-mentioned design, and the supporting plate PL may provide the non-rollable portion NRP and the rollable portion RP with the supporting function. It should be noted that although it is not shown in FIG. 5, the supporting plate PL may for example be attached to the supporting layer SUP through the second adhesion layer AD2 shown in FIG. 2. In addition, as shown in FIG. 5, the portion of the supporting plate PL corresponding to the rollable portion RP may include recesses RE in the present embodiment, but not limited thereto. In some embodiments, the recesses RE may penetrate through the supporting plate PL and expose a portion of the supporting layer SUP. In some other embodiments, the recesses RE may not penetrate through the supporting plate PL. According to some embodiments, the performing order of the step of removing a portion of the supporting layer SUP and the step of disposing the supporting plate PL under the supporting layer SUP may not be limited to the above-mentioned content. In some embodiments, the supporting plate PL may be disposed under the supporting layer SUP at first, and then the portion of the supporting layer SUP is removed.

After that, the step S810 may be performed to dispose the circuit element CE and the protecting glue PG on the bending portion BP of the substrate 102. In detail, as shown in FIG. 6, the circuit element CE may be disposed corresponding to the bending portion BP, that is, the circuit element CE may be disposed on the surface of the bending portion BP, wherein the circuit element CE may for example be electrically connected to the display element DE or other elements of the rollable display device 100 through wires or other suitable electronic elements. The protecting glue PG may at least cover a portion of the circuit element CE, thereby providing the circuit element CE with the protecting effect, but not limited thereto. The protecting glue PG of the present embodiment may include any suitable adhesive. The portion of the protecting glue PG corresponding to the part P5 of the bending portion BP may have a thickness T2, and the portion of the substrate 102 corresponding to the part P5 of the bending portion BP may have a thickness T3. Specifically, the thickness T2 may be defined as the maximum thickness of the portion of the protecting glue PG corresponding to the part P5 of the bending portion BP, and the thickness T3 may be defined as the maximum thickness of the portion of the substrate 102 corresponding to the part P5 of the bending portion BP, but not limited thereto. According to the present embodiment, the thickness T2 may be greater than the thickness T3, and a ratio of the thickness T2 to the thickness T3 may range from 3 to 6 (that is, $3 \leq T2/T3 \leq 6$), but not limited thereto. In detail, when the ratio of the thickness T2 to the thickness T3 is less than 3, the protecting function provided by the protecting glue PG for the circuit element CE may be insufficient. When the ratio of the thickness T2 to the thickness T3 is greater than 6, the flexibility of the bending portion BP may be reduced due to increasing of the thickness of the protecting glue PG. The thickness of the entire substrate 102 of the present embodiment may be uniform, or the thicknesses of different portions of the substrate 102 may substantially be the same, but not limited thereto. In some embodiments, the thicknesses of different portions of the substrate 102 may be different. According to the present embodiment, the thickness of the substrate 102 may for example range from 10 micrometers to 20 micrometers (that is, 10 µm≤thickness of the substrate $102 \leq 20$ µm), such as 15 micrometers, that is, the thickness T3 of the portion of the substrate 102 corresponding to the part P5 of the bending portion BP may range from 10 micrometers to 20 micrometers (that is, 10 µm≤thickness $T3 \leq 20$ µm) in the present embodiment, but not limited thereto. Therefore, according to the present embodiment, since the ratio of the thickness T2 to the thickness T3 may range from 3 to 6, the thickness T2 of the portion of the protecting glue PG corresponding to the part P5 of the bending portion BP may range from 30 micrometers to 120 micrometers (that is, 30 µm≤thickness $T2 \leq 120$ µm), such as 75 micrometers, but not limited thereto. It should be noted that the range of the ratio of the thickness T2 to the thickness T3 mentioned above is just exemplary, and the present disclosure is not limited thereto. In some embodiments, the ratio of the thickness T2 to the thickness T3 may be adjust according to the demands of the design of the product.

After that, the step S812 may be performed to bend the bending portion BP of the substrate 102 backward and fix the supporting layer SUP on the supporting plate PL through the glue layer GL, thereby forming the structure shown in FIG. 7. According to the present embodiment, the glue layer GL may include any suitable adhesive, but the present disclosure is not limited thereto. As shown in FIG. 7, after the bending portion BP is bent and fixed on the rear surface of the supporting plate PL through the glue layer GL, the thickness of the portion of the protecting glue PG corresponding to the part P5 of the bending portion BP may be the thickness T2', and the thickness of the portion of the substrate 102 corresponding to the part P5 of the bending portion BP may be the thickness T3'. That is, the portion of the protecting glue PG corresponding to the part P5 of the bending portion BP may have the thickness T2' when it is in the bending state, and the portion of the substrate 102 corresponding to the part P5 of the bending portion BP may have the thickness T3' when it is in the bending state. According to the present embodiment, the thickness T2 mentioned above may be the maximum thickness of the portion of the protecting glue PG corresponding to the part P5 of the bending portion BP when it is in the non-bending state, and the thickness T3 mentioned above may be the maximum thickness of the portion of the substrate 102 corresponding to the part P5 of the bending portion BP when it is in the non-bending state, wherein the thickness T2' may substantially be the same as the thickness T2, and the thickness T3' may substantially be the same as the thickness T3, but not limited thereto. That is, the ratio of the thickness T2' to the thickness T3' may refer to the above-mentioned content, that is, the ratio of the thickness T2' to the thickness T3' may range from 3 to 6 (that is, $3 \leq T2'/T3' \leq 6$), but not limited thereto. After the step S812 is performed, the rollable display device 100 of the present embodiment may be formed.

It should be noted that the manufacturing method 800 of the rollable display device 100 of the present embodiment is not limited to the steps S802 to S812 mentioned above, and the manufacturing method 800 may further include other suitable processes or steps. In addition, the performing order of the steps S802 to S812 in the manufacturing method 800 is not limited to the above-mentioned content. In some embodiments, the steps S802 to S812 may be performed in any suitable order according to the demands of the process.

Other embodiments of the present disclosure will be described in the following. In order to simplify the description, the same layers or elements in the following embodiments would be labeled with the same symbol, and the features thereof will not be redundantly described. The differences between the embodiments will be detailed in the following.

Referring to FIG. 1 again, in some embodiments, the ratio of the thickness T4 of the portion (that is, the second portion P6) of the supporting layer SUP attached (or corresponding) to the rollable portion RP of the substrate 102 to the thickness T5 of the rollable portion RP may be designed, such that the performance of the rollable display device 100 may be improved. In detail, as shown in FIG. 1, the second portion P6 of the supporting layer SUP may be attached to the rollable portion RP of the substrate 102, the second portion P6 may have a thickness T4, and the rollable portion RP may have a thickness T5. According to some embodiments, the ratio of the thickness T4 of the second portion P6 to the thickness T5 of the rollable portion RP may range from 2 to 8 (that is, $2 \leq T4/T5 \leq 8$). The thicknesses of different portions of the substrate 102 may substantially be the same in the present embodiment. Therefore, the range of the thickness T5 of the rollable portion RP of the substrate 102 may refer to the thickness T3 mentioned above. Referring to FIG. 6, the thickness T3 may be the thickness of the portion of the substrate 102 corresponding to the part P5 of the bending portion BP. For example, the thickness T5 may for example range from 10 micrometers to 20 micrometers (that is, $10 \ \mu m \leq thickness\ T5 \leq 20 \ \mu m$), but not limited thereto. In addition, the thicknesses of different portions of the supporting layer SUP respectively corresponding to different portions of the substrate 102 may substantially be the same, but not limited thereto. Therefore, the range of the thickness T4 of the portion of the supporting layer SUP corresponding to the rollable portion RP may refer to the thickness T1 mentioned above. The thickness T1 may be the thickness of the portion of the supporting layer SUP corresponding to the non-rollable portion NRP. For example, the thickness T4 may for example range from 50 micrometers to 100 micrometers (that is, $50 \ \mu m \leq thickness\ T4 \leq 100 \ \mu m$), but not limited thereto. However, in some other embodiments, the thicknesses of different portions of the supporting layer SUP respectively corresponding to different portions of the substrate 102 may be different. Through the proper design of the thickness T4 and the thickness T5 mentioned above, the supporting layer SUP may provide proper supporting function, thereby preventing the display element DE on the substrate 102 from being break during the folding process or expanding process of the rollable display device 100. In addition, the substrate 102 may provide proper flexibility, which is helpful for expanding and folding of the rollable display device 100. For example, when the thickness T4 of the portion of the supporting layer SUP corresponding to the rollable portion RP is 75 micrometers, the thickness T5 of the rollable portion RP of the substrate 102 may for example be 15 micrometers, and the ratio of the thickness T4 to the thickness T5 may be 5, but not limited thereto. In some embodiments, the ratio of the thickness T4 to the thickness T5 may be adjusted according to the demands of the design of the product.

Figure 9:
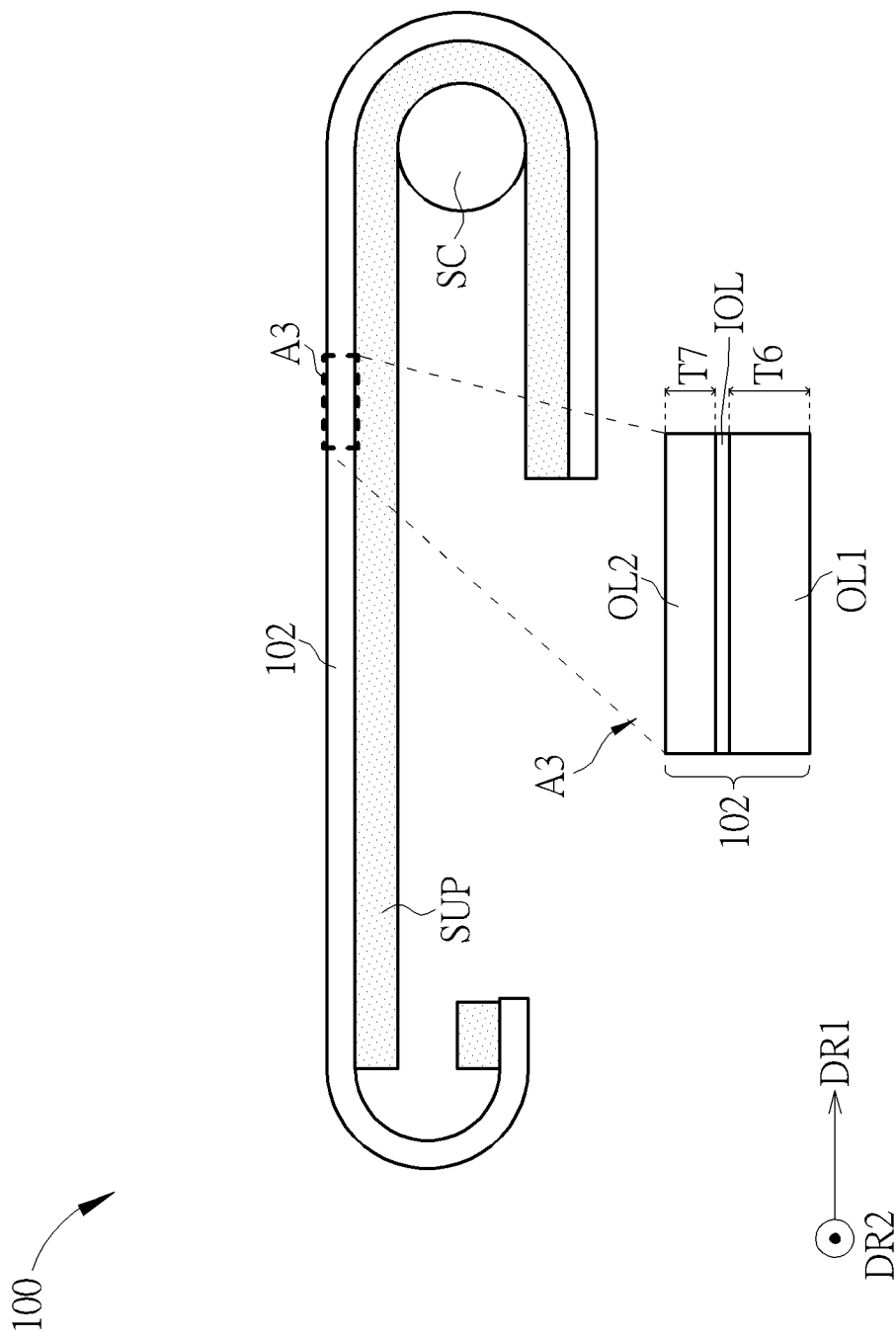
FIG. 9 schematically illustrates a cross-sectional view of an electronic device according to a second embodiment of the present disclosure.

Referring to FIG. 9, FIG. 9 schematically illustrates a cross-sectional view of an electronic device according to a second embodiment of the present disclosure. It should be noted that in order to simplify the figure, FIG. 9 and the following figures just exemplarily show the supporting layer SUP, the substrate 102 and the scroll SC of the rollable display device 100, and other omitted elements and/or layers may refer to the content mentioned above, which will not be redundantly described. In addition, although the supporting layer SUP and the substrate 102 are shown as a single layer in FIG. 9, the structures of the supporting layer SUP and the substrate 102 of the present embodiment are not limited thereto. According to the present embodiment, the substrate 102 may include a multi-layer structure. In detail, as shown in the partial enlarged view of the portion A3 of the substrate 102 in the lower part of FIG. 9, the substrate 102 may for example be formed of a first organic layer OL1, a second organic layer OL2 and an inorganic layer IOL disposed between the first organic layer OL1 and the second organic layer OL2, but not limited thereto. The first organic layer OL1 and the second organic layer OL2 may for example include any suitable organic insulating material, and the inorganic layer IOL may for example include inorganic insulating materials such as silicon oxide, silicon nitride or silicon oxynitride, but not limited thereto. In addition, as shown in FIG. 9, the first organic layer OL1 located at the lower side (or in other words, closer to the supporting layer SUP) of the substrate 102 may have a thickness T6, the second organic layer OL2 located at the upper side (or in other words, further away from the supporting layer SUP) of the substrate 102 may have a thickness T7, and the thickness T6 of the first organic layer OL1 may be greater than the thickness T7 of the second organic layer OL2 in the present embodiment, but not limited thereto. According to the present embodiment, a ratio of the thickness T7 to the thickness T6 may for example be greater than or equal to 0.5 and less than 1 (that is, $0.5 \leq T7/T6 < 1$), and the difference between the thickness T6 and the thickness T7 may for example range from 0.1 micrometers to 6 micrometers (that is, $0.1 \ \mu m \leq T6 - T7 \leq 6 \ \mu m$), but not limited thereto. In detail, according to some embodiments, the thickness T6 of the first organic layer OL1 may be greater than the thickness T7 of the second organic layer OL2, such that the flatness of the inorganic layer IOL disposed on the first organic layer OL1 may be increased, thereby improving the waterproof and anti-oxygen function of the substrate 102. As mentioned above, the thickness of the substrate 102 may for example range from 10 micrometers to 20 micrometers. Therefore, the thicknesses of the first organic layer OL1, the second organic layer OL2 and the inorganic layer IOL of the substrate 102 may be designed through the above-mentioned features in the present embodiment. For example, the thickness of the substrate 102 may for example be 15 micrometers, the thickness T6 of the first organic layer OL1 may for example be 8 micrometers, the thickness T7 of the second organic layer OL2 may for example be 5 micrometers, and the thickness of the inorganic layer IOL may for example be 2 micrometers, but not limited thereto.

Figure 10:
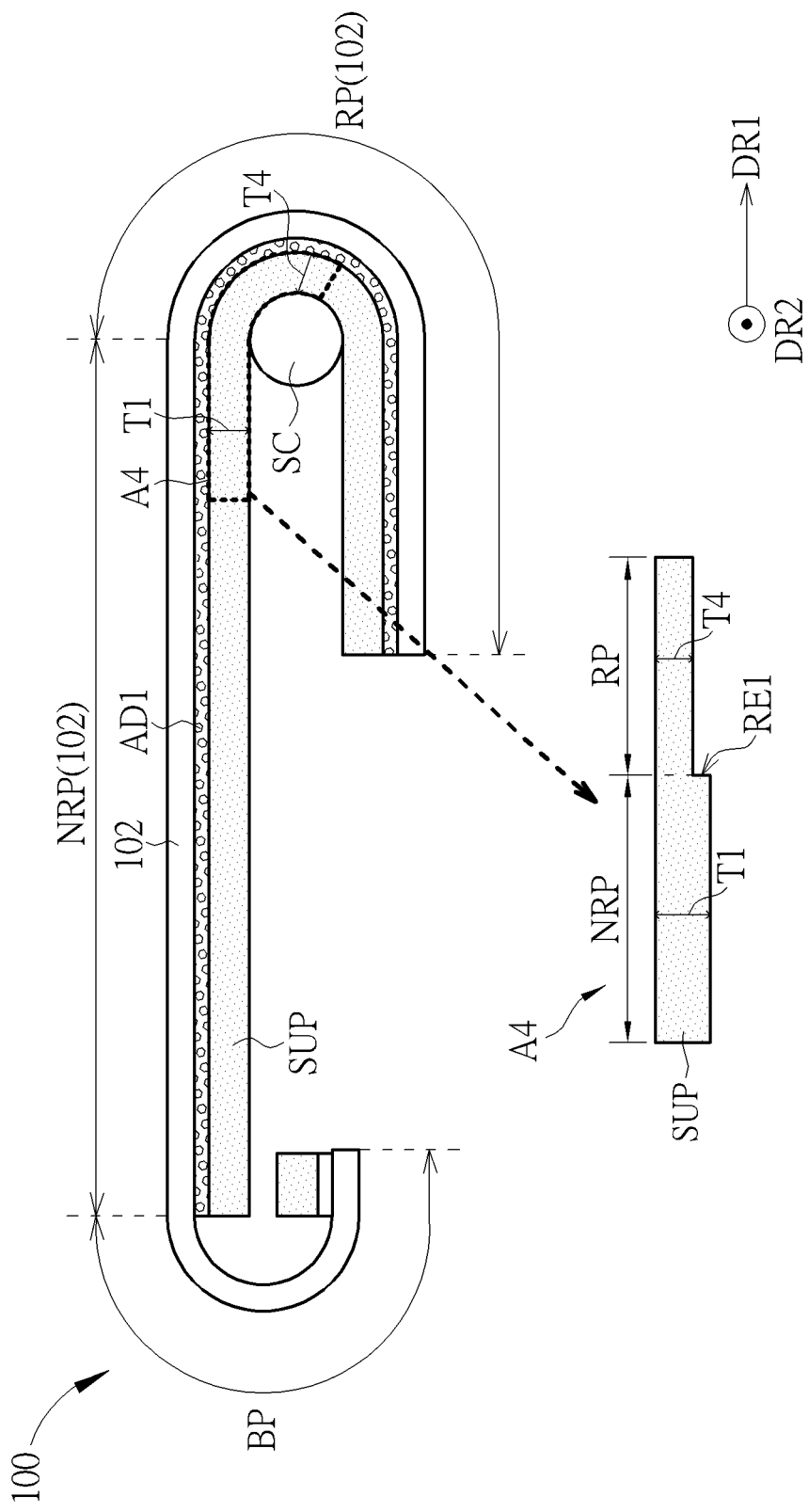
FIG. 10 schematically illustrates a cross-sectional view of an electronic device according to a third embodiment of the present disclosure.

Referring to FIG. 10, FIG. 10 schematically illustrates a cross-sectional view of an electronic device according to a third embodiment of the present disclosure. It should be noted that in order to simplify the figure, FIG. 10 just exemplarily shows the supporting layer SUP, the substrate 102, the scroll SC and the first adhesion layer AD1 for attaching the supporting layer SUP to the substrate 102 of the rollable display device 100, and other elements and/or layers are omitted. In addition, although the supporting layer SUP and the substrate 102 are shown as a single layer in FIG. 10, the structures of the supporting layer SUP and the substrate 102 of the present embodiment are not limited thereto. According to the present embodiment, different portions of the supporting layer SUP respectively attached to different portions of the substrate 102 may have different thicknesses, wherein the thickness of a portion of the supporting layer SUP attached to the non-rollable portion NRP of the substrate 102 may be greater than the thickness of another portion of the supporting layer SUP attached to the rollable portion RP of the substrate 102, but not limited thereto. For example, as shown in the enlarged view of the portion A4 in the lower part of FIG. 10, the thickness T1 of the first portion P4 of the supporting layer SUP attached to the non-rollable portion NRP of the substrate 102 may be greater than the thickness T4 of the second portion P6 of the supporting layer SUP attached to the rollable portion RP of the substrate 102, but not limited thereto. According to some embodiments, the first portion P4 and the second portion P6 of the supporting layer SUP may have the same thickness. In addition, according to the present embodiment, the ratio of the thickness T1 to the thickness T4 may for example be greater than 1 and less than or equal to 1.3 (that is, 1<T1/T4≤1.3), and the difference between the thickness T1 and the thickness T4 may for example range from 0.5 micrometers to 2 micrometers (that is, 0.5 μm≤T1−T4≤2 μm), but not limited thereto. As mentioned above, the thickness T1 may for example range from 50 micrometers to 100 micrometers. Therefore, the thickness T4 may for example range from 39 micrometers to 100 micrometers (that is, 39 μm≤thickness T4≤100 μm), but not limited thereto. For example, when the thickness T1 is 75 micrometers, the thickness T4 may for example be 74 micrometers, but not limited thereto. Since the thickness 14 of the portion of the supporting layer SUP attached to the rollable portion RP of the substrate 102 is lower than the thickness T1 of the portion of the supporting layer SUP attached to the non-rollable portion NRP of the substrate 102, the flexibility of the rollable portion RP of the substrate 102 may be improved. According to the present embodiment, the difference between the thickness T1 and the thickness T4 may be achieved by thinning the portion of the supporting layer SUP attached to the rollable portion RP of the substrate 102. As shown in FIG. 10, a recess RE1 may be formed on the portion of the supporting layer SUP attached to the rollable portion RP of the substrate 102, such that the thickness T4 may be lower than the thickness T1, but not limited thereto.

In addition, in some embodiments, the circuit element CE electrically connected to the display element DE of the rollable display device 100 may separately drive the portion of the display element DE corresponding to the non-rollable portion NRP and the portion of the display element DE corresponding to the rollable portion RP, but not limited thereto. In detail, in the rollable display device 100, the display of the portion of the display element DE corresponding to the non-rollable portion NRP of the substrate 102 may not be adjusted according to the folding degree and/or expanding degree of the rollable display device 100, and the display of the portion of the display element DE corresponding to the rollable portion RP of the substrate 102 may be adjusted according to the folding degree and/or expanding degree of the rollable display device 100. Therefore, the circuit element CE may separately drive the portion of the display element DE corresponding to the non-rollable portion NRP and the portion of the display element DE corresponding to the rollable portion RP, such that different display modes may be adopted in different stretching states. The feature that the circuit element CE may separately drive the portions of the display element DE respectively corresponding to different portions of the substrate 102 may be applied to each of the embodiments of the present disclosure, and will not be redundantly described in the following.

Figure 11:
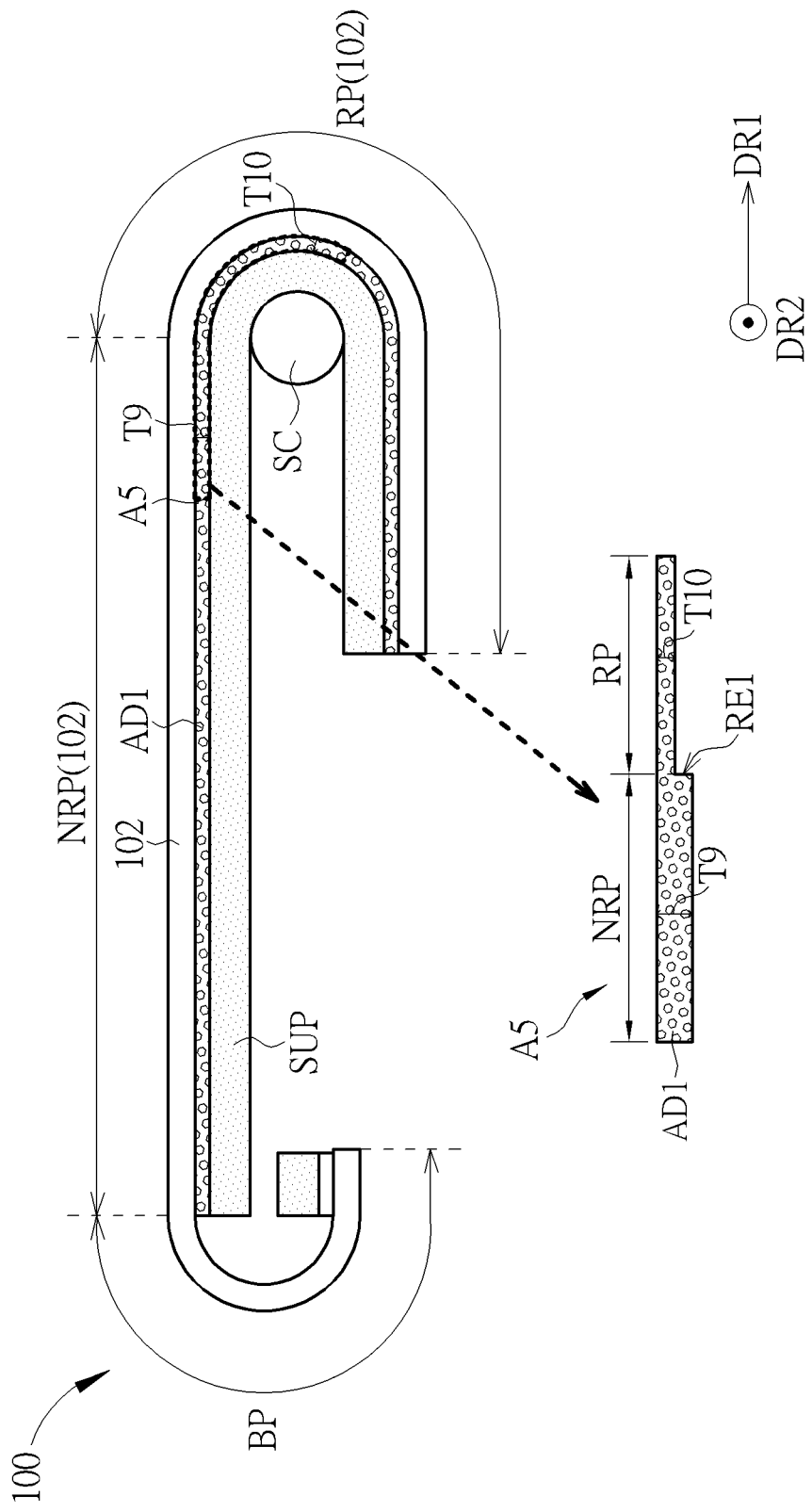
FIG. 11 schematically illustrates a cross-sectional view of an electronic device according to a fourth embodiment of the present disclosure.

Referring to FIG. 11, FIG. 11 schematically illustrates a cross-sectional view of an electronic device according to a fourth embodiment of the present disclosure. It should be noted that in order to simplify the figure, FIG. 11 just exemplarily shows the supporting layer SUP, the substrate 102, the scroll SC and the first adhesion layer AD1 for attaching the supporting layer SUP to the substrate 102 of the rollable display device 100, and other elements and/or layers are omitted. In addition, although the supporting layer SUP and the substrate 102 are shown as a single layer in FIG. 11, the structures of the supporting layer SUP and the substrate 102 of the present embodiment are not limited thereto. According to the present embodiment, the portions of the first adhesion layer AD1 respectively corresponding to different portions of the substrate 102 may include different thicknesses, wherein the thickness of a portion of the first adhesion layer AD1 corresponding to the non-rollable portion NRP may be greater than the thickness of another portion of the first adhesion layer AD1 corresponding to the rollable portion RP, but not limited thereto. In some embodiments, the thickness of the first adhesion layer AD1 may be uniform, that is, different portions of the first adhesion layer AD1 respectively corresponding to different portions of the substrate 102 may substantially have the same thickness. For example, as shown in the enlarged view of the portion A5 in the lower part of FIG. 11, the portion of the first adhesion layer AD1 corresponding to the non-rollable portion NRP may for example have a thickness T9, and the portion of the first adhesion layer AD1 corresponding to the rollable portion RP may for example have a thickness T10, wherein the thickness T9 may be greater than the thickness T10, but not limited thereto. In addition, according to the present embodiment, a ratio of the thickness T9 to the thickness T10 may for example be greater than 1 and less than or equal to 1.3 (that is, 1<T9/T10≤1.3), and the difference between the thickness T9 and the thickness T10 may for example range from 0.5 micrometers to 5 micrometers (that is, 0.5 μm≤T9−T10≤5 μm), but not limited thereto. According to the present embodiment, the thickness T9 of the portion of the first adhesion layer AD1 corresponding to the non-rollable portion NRP may for example range from 50 micrometers to 100 micrometers (that is, 50 μm≤thickness T9≤100 μm). Therefore, the thickness T10 may for example range from 39 micrometers to 100 micrometers (that is, 39 μm≤thickness T10≤100 μm), but not limited thereto. For example, when the thickness T9 is 70 micrometers, the thickness T10 may for example be 68 micrometers, but not limited thereto. Since the thickness T10 of the portion of the first adhesion layer AD1 corresponding to the rollable portion RP may be lower than the thickness T9 of the portion of the first adhesion layer AD1 corresponding to the non-rollable portion NRP in the present embodiment, the flexibility of the rollable portion RP of the substrate 102 may be improved. The difference between the thickness T9 and the thickness T10 may for example be achieved by thinning the portion of the first adhesion layer AD1 corresponding to the rollable portion RP in the present embodiment. In detail, as shown in FIG. 11, a recess RE2 may be formed on the portion of the first adhesion layer AD1 corresponding to the rollable portion RP, such that the thickness T10 may be lower than the thickness T9, but not limited thereto.

Figure 12:
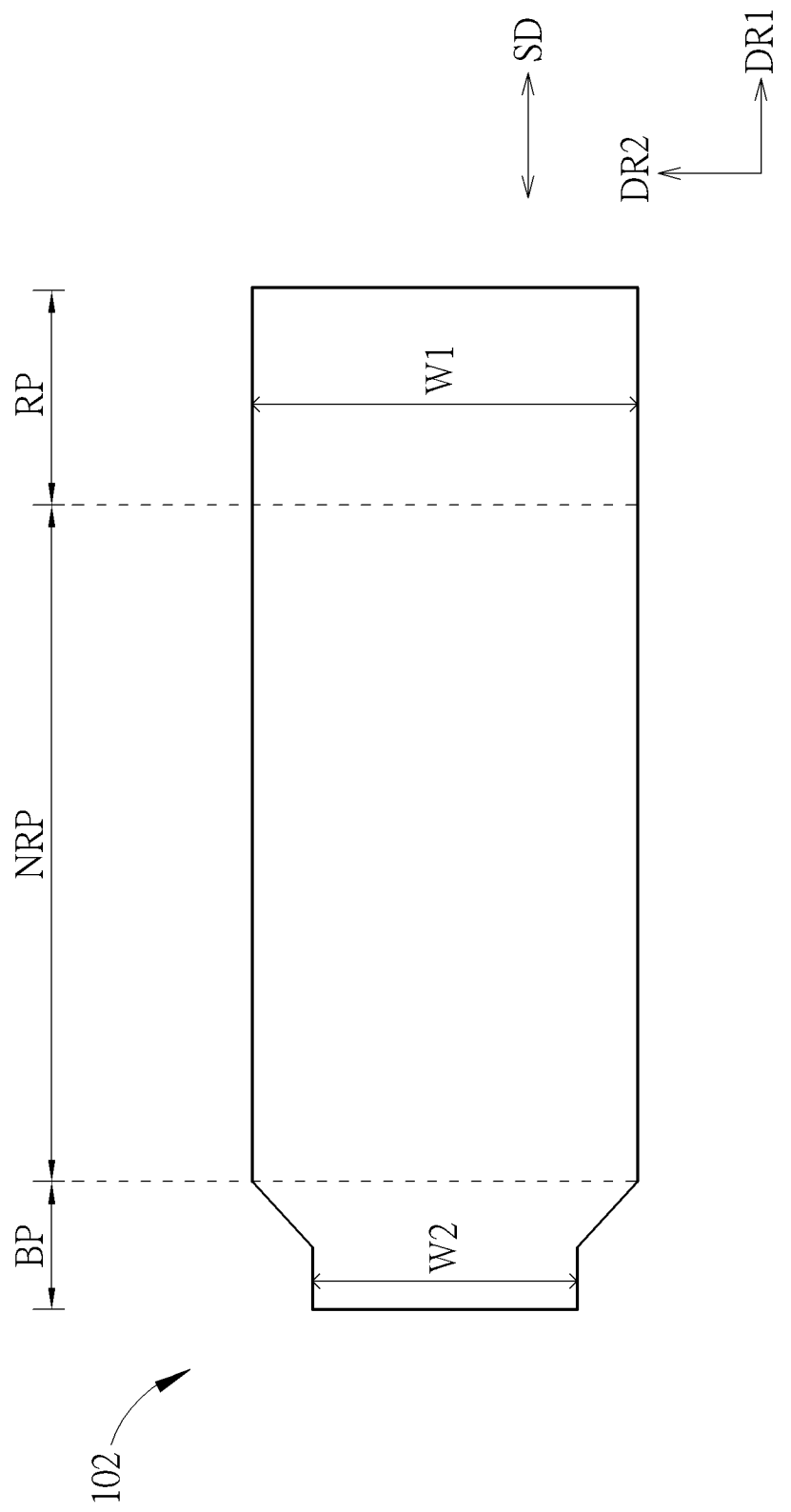
FIG. 12 schematically illustrates a top view of a substrate of an electronic device according to a fifth embodiment of the present disclosure.

Referring to FIG. 12, FIG. 12 schematically illustrates a top view of a substrate of an electronic device according to a fifth embodiment of the present disclosure. According to the present embodiment, different portions of the substrate 102 may have different widths, wherein the width of the bending portion BP may for example be lower than the widths of the rollable portion RP, but not limited thereto. In detail, as shown in FIG. 12, the minimum width of the rollable portion RP of the substrate 102 in the second direction DR2 may be the width W1, the minimum width of the bending portion BP of the substrate 102 in the second direction DR2 may be the width W2, wherein the width W1 may be greater than the width W2. The second direction DR2 mentioned above may for example be perpendicular to the expanding-folding direction SD of the rollable display device 100, but not limited thereto. Since the width W2 of the bending portion BP may be lower than the width W1 of the rollable portion RP in the present embodiment, the flexibility of the bending portion BP may be improved, such that the bending portion BP may be easily bent to the rear surface of the rollable display device 100, thereby achieving the effect of narrow border of the rollable display device 100. In addition, the range of the ratio of the width W2 to the width W1 may for example be located between 0.5 and 1 (that is, 0.5<W2/W1<1), but not limited thereto. When the ratio of the width W2 to the width W1 is less than 0.5, the density of the wires for electrically connecting the circuit element CE and the electronic elements (such as the display element DE) of the rollable display device 100 may be increased, such that abnormal conditions in the bending portion BP may increase. When the ratio of the width W2 to the width W1 is greater than 1, the flexibility of the bending portion BP may be reduced. In the present embodiment, as shown in FIG. 12, the width of the non-rollable portion NRP of the substrate 102 and the width of the rollable portion RP may be the same, but not limited thereto. In some embodiments, the width of the non-rollable portion NRP and the width of the rollable portion RP may be different.

In summary, a rollable display device is provided by the present disclosure, wherein the substrate of the rollable display device may include the bending portion, the rollable portion and the non-rollable portion. Since different portions of the supporting layer of the rollable display device respectively corresponding to different portions of the substrate can include different designs, the support or flexibility of different portions of the substrate may be improved, thereby improving the yield or using experience of the display device. In addition, the thickness of the layers of the rollable display device may be designed, such that the flexibility of the display device may be further improved.

Those skilled in the art will readily observe that numerous modifications and alterations of the device and method may be made while retaining the teachings of the disclosure. Accordingly, the above disclosure should be construed as limited only by the metes and bounds of the appended claims.

What is claimed is:

1. A rollable display device, comprising:
    a substrate having a bending portion, a non-rollable portion and a rollable portion, wherein the non-rollable portion is disposed between the bending portion and the rollable portion;
    a display element disposed on the rollable portion;
    a circuit element disposed on the bending portion and electrically connected to the display element;
    a supporting layer disposed under the substrate, wherein at least a part of the bending portion is not attached by the supporting layer; and
    an adhesion layer adhered between the substrate and the supporting layer,
    wherein the adhesion layer comprises a first portion adhered to the rollable portion of the substrate and a second portion adhered to the non-rollable portion of the substrate, and a thickness of the first portion is less than a thickness of the second portion,
    wherein a radius of curvature of the bending portion is less than a radius of curvature of the rollable portion,
    wherein the supporting layer comprises a third portion adhered to the rollable portion of the substrate and a fourth portion adhered to the non-rollable portion of the substrate, and a thickness of the third portion is less than a thickness of the fourth portion,
    wherein in a first direction perpendicular to a surface of the non-rollable portion, the bending portion and the non-rollable portion are partially overlapped.

2. The rollable display device according to claim 1, wherein the radius of curvature of the bending portion is less than 20 times the thickness of the fourth portion of the supporting layer.

3. The rollable display device according to claim 1, wherein a ratio of the thickness of the third portion of the supporting layer to a thickness of the rollable portion is ranged from 2 to 8.

4. The rollable display device according to claim 1, wherein the substrate comprises a first organic layer, a second organic layer on the first organic layer and an inorganic layer disposed between the first organic layer and the second organic layer.

5. The rollable display device according to claim 4, wherein a thickness of the first organic layer is greater than a thickness of the second organic layer in the rollable portion.

6. The rollable display device according to claim 1, wherein in a top view, the rollable portion of the substrate has a first width along a second direction, the bending portion of the substrate has a second width along the second direction, and the second width is less than the first width.

* * * * *